（12）United States Patent
Kim

(10) Patent No.: US 11,502,087 B2
(45) Date of Patent: Nov. 15, 2022

(54) SEMICONDUCTOR STRUCTURE AND METHOD FOR FABRICATING THE SAME

(71) Applicant: XIA TAI XIN SEMICONDUCTOR (QING DAO) LTD., Qingdao (CN)

(72) Inventor: Il-Goo Kim, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/747,535

(22) Filed: Jan. 21, 2020

(65) Prior Publication Data

US 2021/0225849 A1 Jul. 22, 2021

(51) Int. Cl.
*H01L 27/108* (2006.01)

(52) U.S. Cl.
CPC .. *H01L 27/10855* (2013.01); *H01L 27/10814* (2013.01); *H01L 27/10823* (2013.01); *H01L 27/10876* (2013.01)

(58) Field of Classification Search
None
See application file for complete search history.

(56) References Cited

U.S. PATENT DOCUMENTS

| 2009/0206443 | A1* | 8/2009 | Juengling | H01L 27/10826 257/506 |
| 2012/0126885 | A1* | 5/2012 | Juengling | H01L 27/0886 327/581 |
| 2015/0340237 | A1* | 11/2015 | Rezanezhad Gatabi | H01L 29/8605 257/316 |
| 2016/0197084 | A1 | 7/2016 | Yoon | |
| 2017/0200803 | A1* | 7/2017 | Lee | H01L 29/511 |
| 2018/0158819 | A1* | 6/2018 | Bae | H01L 21/31053 |
| 2018/0342518 | A1* | 11/2018 | Kim | H01L 27/10879 |

* cited by examiner

*Primary Examiner* — Steven M Christopher
(74) *Attorney, Agent, or Firm* — ScienBiziP, P.C.

(57) ABSTRACT

A semiconductor structure and a method of fabricating the same are disclosed. The semiconductor device comprises: a first active region over a substrate; and a first bit line structure intercepting the first active region at a level that is lower than a top-most surface thereof, the first bit line structure including a barrier liner having a U-profile in a width direction thereof in electrical contact with the first active region.

13 Claims, 9 Drawing Sheets

SEMICONDUCTOR STRUCTURE AND METHOD FOR FABRICATING THE SAME

FIELD

The present disclosure generally relates to fabrication of semiconductor device, and more particularly pertains to providing a streamlined data-line formation scheme that enables self-assembled contact formation for semiconductor devices such as random dynamic access memory (DRAM) devices.

BACKGROUND

As integrated circuits (IC) are developed, the desire for higher device density and operation speed becomes never-ending quests for those skilled in the art. With increased feature density in the IC device, the allowed critical dimension of various device features drastically shrinks. To this end, advanced lithography techniques (e.g., multiple-patterning lithography) or expensive fabrication equipment (e.g., extreme ultra-violet, EUV lithography equipment) are often required, which drives up the fabrication costs and process complexity. By way of example, multiple patterning techniques require a plurality of photo-masks and multiple layers of etch mask to define high-density features in a single device layer. However, each photo-mask translates to extra costs, as well as posts additional reliability risk due to alignment/overlay challenges.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
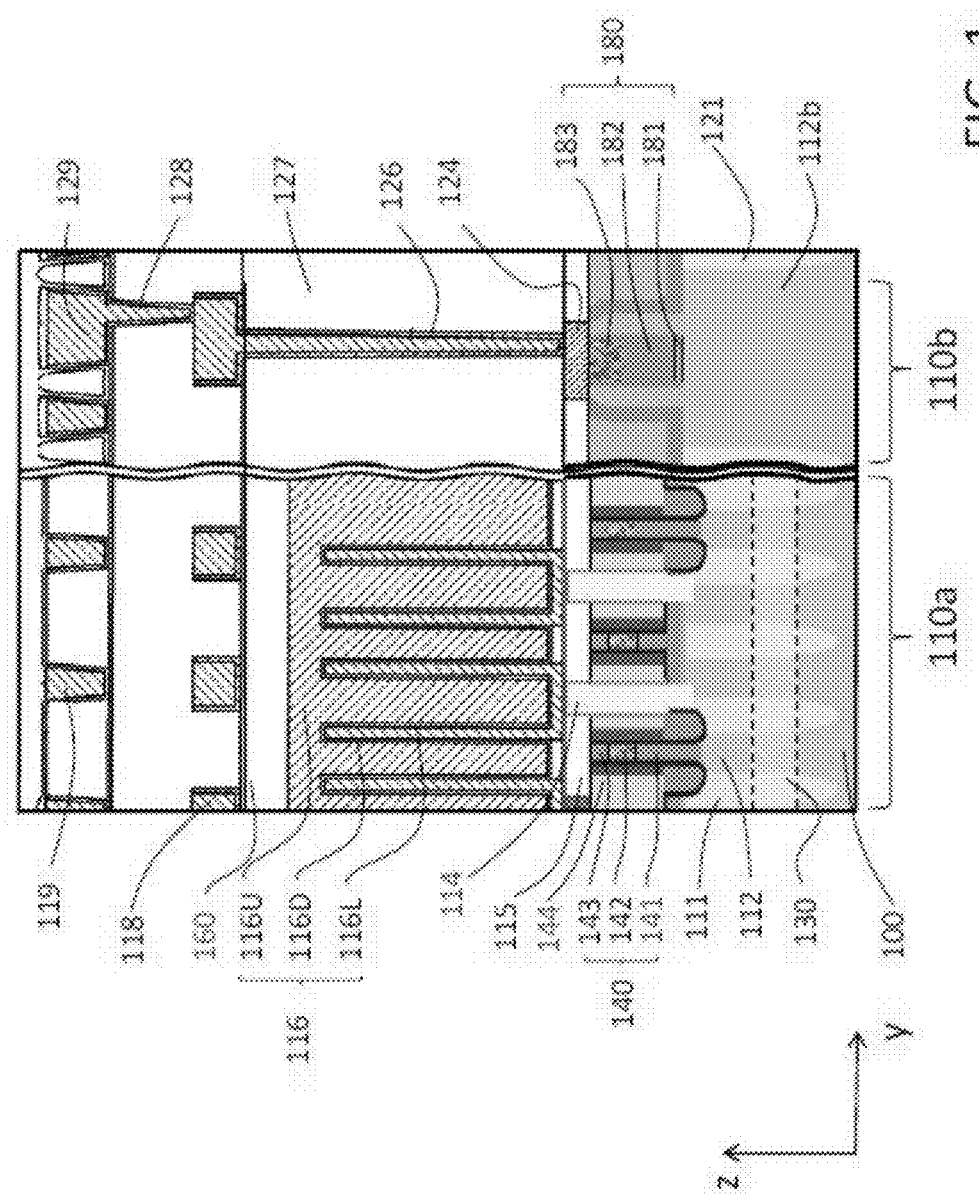
FIG. 1 shows a regional cross section view of a semiconductor device in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout. In addition, reference numerals for comparable elements in different figures may be omitted for simplicity and clarity of illustration.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 9. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 shows a regional cross section view of a semiconductor device in accordance with some embodiments of the instant disclosure. The exemplary device includes a substrate 100 over which multiple layers of integrated circuit devices and features are formed. For illustrational simplicity and clarity, some detail/sub components of the exemplary device are not explicitly labeled in the instant figure.

The substrate 100 may comprise a crystalline silicon substrate. The substrate may comprise various doped regions depending on design requirements (e.g., p-type substrate or n-type substrate). The doped regions may be doped with p-type dopant, such as boron or BF2; n-type dopant, such as phosphorus or arsenic; and/or combinations thereof. In some alternative embodiments, the substrate 100 may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epi-layer) and/or may include a silicon-on-insulator (SOI) structure, such as a silicon-on-insulator (SOI) structure, SiGe-on insulator (SiGeOI), Ge on insulator (GeOI) and the like.

Several functional regions may be arranged laterally (e.g., horizontally across the page as shown in FIG. 1) over the substrate. By way of example, FIG. 1 shows a substrate of an exemplary device that includes two co-planar arranged functional regions defined thereon, e.g., a cell region 110*a* and a periphery region 110*b*. In the illustrated example, the cell region 110*a* provides space to accommodate active circuit components (e.g., selection transistor 130) and passive circuit components (e.g., storage element, such as capacitor 116) of a DRAM device. Meanwhile, the periphery region 110*b* houses circuit components for supporting various functions of the DRAM operation, such as read out circuits, decoder circuits, and amplifier circuits. Different functional regions may include circuit components of different critical dimensions based on different design rules. The devices in different functional regions may be designed to function under different operational requirements (e.g., different voltage rage). Devices of different feature dimensions may be arranged on the same plane of a substrate (e.g., circuit chip) to achieve higher degree of integration, hence reduce signal path and enhance device performance.

The cell region may comprise array of memory unit cells. Each of the memory cell units typically includes a bit storage component (e.g., storage capacitor 116) and a selection component (e.g., having transistor gate structure 130). The unit cells may employ suitable cell architecture, e.g., a 1-T cell format (as shown in the instant example) or other types of cell arrangement (such as a 3T cell layout, not shown). The cell region 110*a* of the illustrated device are shown to have a gate structure 130 traversing (buried) under a top surface of a plurality of active areas (e.g., fin structure 112) that rests between isolation features (e.g., shallow trench isolation (STI) structure 111).

Figure 2:
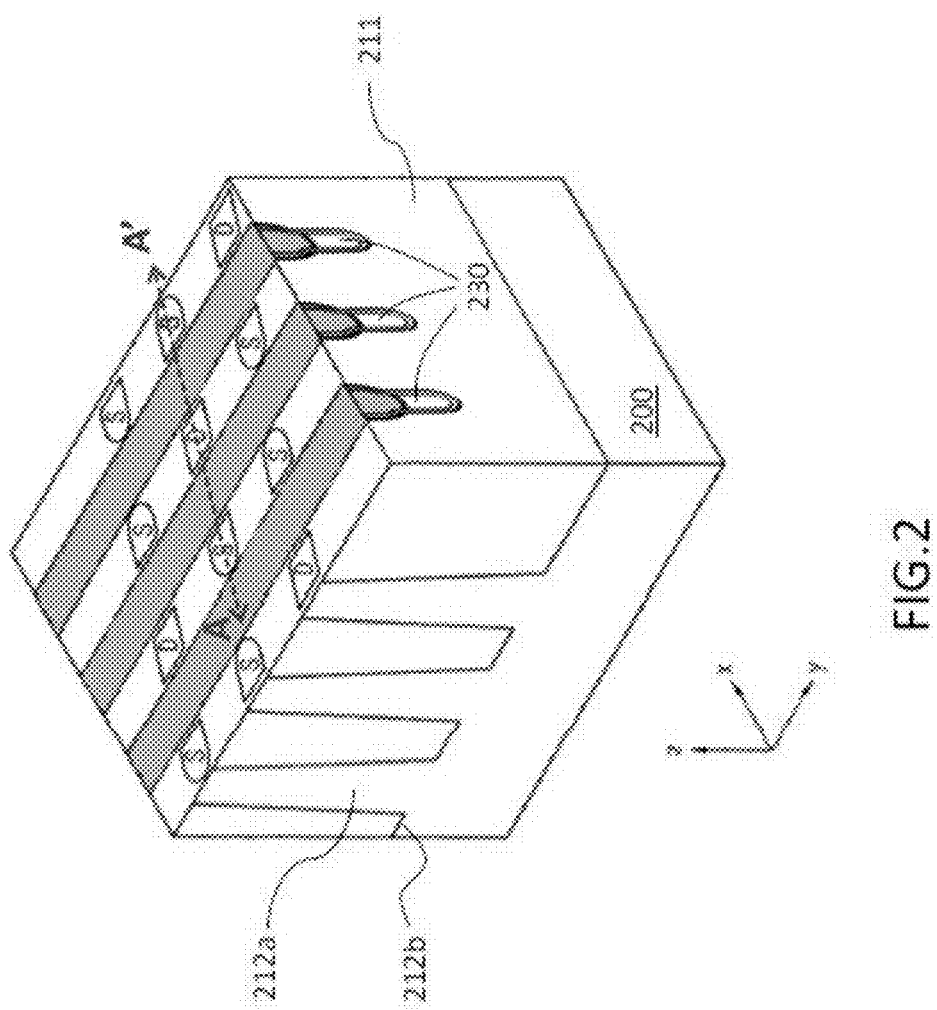
FIG. 2 shows an isometric illustration of an active area arrangement of a semiconductor device in accordance with some embodiments of the instant disclosure.
Figure 3:
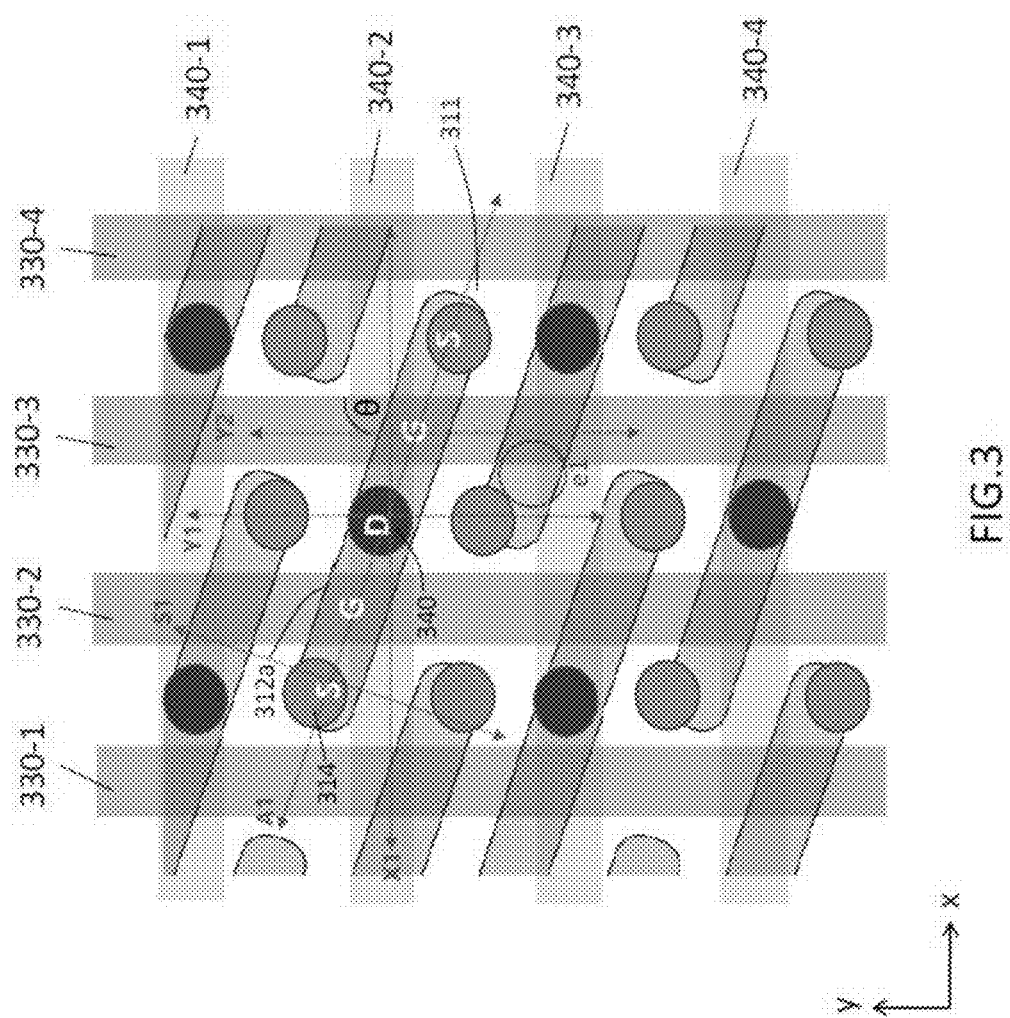
FIG. 3 shows a schematic planar layout view of an active area arrangement of a semiconductor device in accordance with some embodiments of the instant disclosure.

In some embodiments, the active area (AA) may comprise a raised island structure (with respect to a lower surface of the substrate) having an elongated strip overhead profile and surrounded by isolation structure (e.g., STI 111). In some embodiments, the active area 112 may be obliquely arranged with respect to the traversing direction of a word line (e.g., the extending direction of the gate structure 130) at a slanting angle. For example, as shown in FIG. 2 and FIG. 3, the illustrated portion of an exemplary substrate 200 shows three raised fin-like features (e.g., raised portion 212*a*) extending away from an lower active surface 212*b* (e.g., x-y plane) along a vertical direction (e.g., z-axis). Depending on critical dimension scale, in some embodiments, the lower surface 212*b* of the substrate 200 may not be as flat as schematically illustrated in the instant figure. For instance, in some embodiments where active area spacing is small, the lower surface of the substrate may possess a parabolic profile.

Reference is concurrently made to FIG. 2, the plurality of active areas (e.g., 212*a*) are surrounded by dielectric material (e.g., STI 211). In some embodiments, each of the active areas 212*a* has an elongated profile that defines a long axis (e.g., A-A') and is obliquely arranged with respect to the x/y-axis. The oblique arrangement of the active areas in a folded/offset layout may allow more unit cells to be packed in a same area while maintaining sufficient distance therebetween, thus achieving higher device density while reducing inter-cell interference (e.g., cross talk).

The gate structure 130 may be part of a memory cell selection device, such as a buried channel array transistor (BCAT). In the illustrated example, the active area 112 (defined between a pair of isolation features 111) has a pair of gate structures 130 embedded at a lower portion thereof (e.g., extending laterally across the page). The embedding gate structure 130 and the semiconductor region of the active area cooperatively define a pair of BCATs (whose respective source/drain (S/D) regions being connected to a contact plug, e.g., contact plug/via 114). The contact plug 114 enables electrical connection between the selection transistor (e.g., BCAT) to a lower electrode (e.g., 116L) of a storage capacitor 116 (e.g., through a pad not specifically labeled).

The gate structure 130 of an exemplary buried type device may comprise a embedded structure (in a cross sectional profile) disposed/filling in a gate trench in the active area. In DRAM applications, the gate structure 130 may be a laterally traversing linear structure (e.g., as shown in FIG. 2 and FIG. 3) that intercepts multiple adjacent active areas (as shown in FIG. 1) and serves as a word line (WL) for a memory device.

In the illustrated embodiment, several bit line (BL) stack features 140 are formed over the cell region 110*a*. In practical applications, the BL stack features 140 may be a laterally traversing linear structure (e.g., extending in/out of the page of, e.g., FIG. 1) that projectively intercepts multiple word lines (e.g., word lines 130). Each of the BL stack features 140 comprises a BL contact plug 141, a BL conductor 142, and a BL mask pattern 143. The BL conductor 142 is part of a memory cell selection device that electronically connect to an active region that serve as a source of the selection device through the BL contact 141. The BL contact plug 141 may be part of a vertical interconnect component, and can be made of conductive material such as metal or doped poly silicon. The BL conductor 142 may be part of a horizontal interconnect component, and may include conductive material such as tungsten.

To ensure structural integrity and electrical insulation between nearby components, bit line spacers 144 made of dielectric material is provided over the sidewall of the BL stack feature 140. In some embodiments, the BL spacer 144 comprises a composite structure made of more than one sub-layers. In some embodiments, certain portions of the BL spacer 144 may extend downward into the isolation structure (e.g., STI 111) and be in contact with a corner region of an active area (e.g., AA 112). In some embodiments, the BL spacer 144 may be made of low-K material to mitigate parasitic capacitance. In some embodiments, air gaps/voids may be incorporated among BL spacers to further reduce cross talk effect.

In the illustrated embodiment, the gate structure 130 comprises a gate electrode (not labeled) embedded at a lower portion of the gate trench (e.g., partially filling) in the active area (a more complete illustration of the buried type gate structure can be seen in FIG. 5(d)). The gate electrode may include one or more conductive material such as doped polysilicon, or metal material such as tungsten, ruthenium, and cobalt. The gate structure 130 also comprises a gate insulation liner that lines the bottom portion of the trench, and is arranged between the gate electrode and the semiconductor material of the active area.

The buried type transistor becomes a suitable candidate thanks to its extended channel length (e.g., from a S/D region under a contact plug 114 vertically down to the bottom tip of the gate structure 130, then laterally across the tip of to the buried gate electrode and back up to the opposite S/D region under a neighboring contact plug), which enables higher device density while alleviating the accompanied short channel effect.

The gate insulation liner may be a conformally formed insulating layer covering an inner side wall of the gate trench. The gate dielectric liner may be made of insulating material such as silicon oxide, silicon nitride, silicon oxynitride, or a metal oxide. The metal oxide may include, for example, hafnium oxide, aluminum oxide, or titanium oxide. High-K dielectric materials may be utilized to complement metal based gate electrodes for enhancing the performance of a field effect transistor. In some embodiments, the gate structure 130 may further comprise a barrier liner conformally disposed between the gate dielectric liner and the gate electrode. The gate barrier liner may comprise a barrier metal compound, such as, tungsten nitride (WN), titanium nitride (TiN) or tantalum nitride (TaN).

In the illustrated embodiment, a shared S/D region is defined between the pair of neighboring gate structures 130 in the active area (e.g., may be better visualized by the region "D" in FIG. 2). In some embodiments, bit line 140 is arranged over the shared S/D region formed between the gate structures 130 at a central region of the active area (between STI structures 111). The bit line 140 may electrically connect a plurality of S/D regions at the respective central region of multiple active areas (e.g., the respective S/D region of a plurality of active areas arranged in a roll; not shown in the instant regional cross section view).

The contact plug 114 may be formed in and through a dielectric layer (e.g., interlayer dielectric, ILD) above the active area, thereby establishing a vertical conductive path from the surface of the substrate 100 to upper layers of the device stack over the active area. In some embodiments, the contact plug 114 may serve as a storage node via plug that enables vertical electrical connection with a lower electrode of a storage element (e.g., electrode 116L of the capacitor element 116). The ILD layer may be made of materials such as oxide or nitride of silicon. In some embodiments, the dielectric layer may include low-K material having dielectric constant lower than, e.g., 3.9. The contact plug 114 may be made of one or more metal or non-metal conductive material, such as poly-silicon, tungsten, aluminum, etc.

Storage element (such as storage capacitor 116) may be formed over the storage node contact plug 114, whose bottom end is electrically connected to a portion of the active region. The storage capacitor 116 comprises lower electrode 116L, upper electrode 116U, and capacitor dielectric 116D arranged between the upper and the lower electrodes.

A separation layer (e.g., layer 115) may be provided over the contact plug 114, through which the lower electrode of the storage capacitor 116 (e.g., bottom electrode 116L) is formed to establish electrical connection with the contact plug 14. The separation layer may comprise nitride material (e.g., silicon nitride) and serve as etch stop during the fabrication process of the capacitor structure. It is noted that the term "lower" electrode is made with respect to the surface of the substrate for the ease of referral, and shall not be construed as an undue limitation as to device orientation. The contact plug 114 provides a vertical conduction path between the source/drain region of the selection device (e.g., transistor 130) and the lower electrode of the storage element (e.g., electrode 116L).

In some embodiments, the lower electrode 116L may be a cylindrical conductive structure having high aspect ratio (i.e., high depth to width ratio), which corresponds to a tall upward opening U-shaped cross sectional profile (as shown the instant example). In some embodiments, a lateral width of the conductive structure may be few tens of nanometer in scale, e.g., having critical dimension of about 40 nm. In some embodiments, the aspect ratio of the lower electrode 116L may range from about 10 to 40. The lower electrode 116L may be formed from a conformal conductive film made of one or more conductive material(s) such as poly-silicon, SiGe, BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$).

The capacitor dielectric 116D may be a conformally formed layer that comprises a nitride, an oxide, a metal oxide, or a combination thereof. For example, the capacitor dielectric 116D may include a single or a multilayered film formed from silicon nitride, silicon oxide, a metal oxide (e.g., HfO$_2$, ZrO$_2$, Al$_2$O$_3$, La$_2$O$_3$, Ta$_2$O$_3$, and TiO$_2$), a perovskite dielectric material (e.g., STO (SrTiO$_3$), BST ((Ba,Sr)TiO$_3$), BaTiO$_3$, PZT, and PLZT, or a combination thereof. In some embodiments, high-K dielectric material may be applied to boost capacitor performance, e.g., enhance capacitance for a given electrode surface area.

The upper electrode 116U may be formed of one or more conductive material such as doped semiconductor, conductive metal nitride, metal, metal silicide, conductive oxide, or a combination thereof. For instance, the upper electrode 116U may be formed of conducive material(s) including BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$), though the list of suitable material is merely exemplary and not exhaustive.

Additional conductive features, such as interconnect features 118 and 119 may be formed in additional inter metal dielectric layers over the upper electrode 116U to enable interconnection between circuit elements.

As the level of device integration increases, feature density also increases. By way of example, the feature density among the interconnect features (e.g., planar interconnect components such as features 118/119/129, or vertical interconnect components such as features 114/124/126/128) is increased considerably in modern semiconductor devices compared to their preceding counterparts. As such, not only the feature dimension thereof shrinks, the inter-feature distance/separation is also reduced.

The reduction of pitch distance between vertical interconnect components (e.g., contact plugs 141 or storage node contacts 114) often results in the need for advanced fabrication techniques (e.g., multiple-patterning lithography) or expensive fabrication equipment (e.g., extreme ultra-violet, EUV lithography equipment), which drives up the fabrication costs and complexity. For instance, multiple patterning techniques require the use of a plurality of photo-masks (as well as multiple layers of hard/soft masks) to define the numerous closely distributed contact features (e.g., the vertical contact plugs 141/114). Each photo-mask translates to extra cost, as well as posts additional reliability risk due to alignment/overlay challenges. In addition, densely aggregated interconnect patterns in an inter metal dielectric layer often leads to adverse cross talk effects.

In some embodiments, voids (e.g., air gaps) may be incorporated between interconnect features to alleviate the undesirable parasitic effects. As air has very low dielectric constant (of about 1.0000), voids in a structure can provide an equivalent dielectric constant of as low as about 1.00059. Thus, the dielectric constant of a porous structure may be significantly lower than a conventional inter metal dielectrics. In the instant embodiment, air gaps are generated between adjacent conductive features to provide reduced regional dielectric constant. In general, under permissible process circumstance(s), maximized air gap size and uniform air gap profile (e.g., identical width and height of voids) may provide enhanced result in cross talk reduction.

It is to be noted that, the term "air gap" generally refers to the absence of material filling in a particular region (thereby forming a structure with void), and does not necessarily imply the gaseous content therein. In some embodiments, the voids between interconnect features may be substantially filed with one or more inert gas such as gaseous argon or nitrogen. In some embodiments, the voids (air gaps) between the interconnect features may be substantially vacuum.

The periphery region 110b may comprise various active device regions laterally separated by isolation features, such as STI 121. The active area 112b may comprise active circuit components (such as transistor gate structure 180) that make up the periphery support circuits, e.g., read-out, decoder, or amplifier circuits. The gate structure 180 may include gate dielectric 181, a gate material 182 on the gate dielectric 181, and gate capping material 183 on the gate material 182. The conductive material 183 may include tungsten.

Over the active area there may be upper inter device layers, such as dielectric layer 127, through which contact via/plug 124 may be provided to enable vertical signal conduction from the surface of the substrate 100 to a higher device layer. The contact plug 124 may be connected to a corresponding contact pad (not specifically labeled) thereabove in a fashion similar to that in the cell region 110a.

Over the contact plug 124 of the presently illustrated embodiment is a dielectric layer 127, through which one or more high aspect ratio interconnect features (e.g., contact via 126) are formed. In some embodiments, the aspect ratio of the contact via 126 may have a range from about 10 to 40. In some embodiments, the design rules for the devices in periphery region 110b may assume a greater feature sizes than that in the cell region 110a. In some embodiments, the active circuit components in the periphery region 110b are designed to operate at a higher voltage level than those in the cell region 110a.

The high aspect ratio features in both the cell region 110a and the periphery region 110b are typically formed through a top-down fashion, such as etching. The etching of high aspect ratio features often takes place through one or more relatively thick device layer (e.g., 127). In some embodiments, special process arrangement and technique could be utilized to generate high aspect ratio feature having lateral/sidewall profile that is substantially normal (vertically perpendicular) with respect to a major surface of the substrate.

Referring again to FIG. 2 and FIG. 3. FIG. 2 shows an isometric illustration of an active area arrangement of a semiconductor device in accordance with some embodiments of the instant disclosure. FIG. 3 shows a plane view of an active area arrangement of a semiconductor device in accordance with some embodiments of the instant disclosure.

In the illustrated cut-away view, the shown portion of the substrate 200 defines a lower surface (e.g., 212b) and a plurality columns (e.g., 3 columns in the shown example) of fin-like features (e.g., 212a) protruding from the lower substrate surface 212b generally along the z-axis direction. The fin-like features 212a embedded in (and surrounded by) insulating material (e.g., 211/311) may be made from semiconductor material, e.g., through either top-down method such as etching or bottom-up method such as epitaxial formation.

In the illustrated embodiment, the rounded planar contour of the active area (e.g., the regions with "S" labels) on the exposed x-y plane represents the terminal portions of one of many active areas 212a arranged in a column. By way of example, the illustrated portion in FIG. 2 shows three columns of active areas extending abreast one another. Moreover, each column comprises two rows of active areas arranged in a laterally off-set configuration. For instance, as shown in FIGS. 2 and 3, an active area from each column of the fin-like features possess a strip profile that spans from a first end region (labeled "S"), a first control line intercepted region (e.g., by a control line 230), a middle region (labeled "D"), a second control line intercepted region, and terminates at a second end region (with label "S"). In addition, the laterally off-set configuration may be observed by the arrangement where a first end region of one active area is laterally aligned (e.g., in the x-direction) with a middle region of a neighboring active area from an adjacent column.

Each of the control line structures 230 (shown in the instant example to be extending along the x-axis direction) may intercept multiple rows of active areas and functions as a shared gate line. For instance, the control line structure 230 may serve as a word line for a memory device. As shown in FIGS. 2 and 3, each active area 212a is intercepted by two control line structures 230. The two intercepting control lines 230 crossing an active area correspond to the gates of a pair of BCATs, where the region between the control lines 230 defines a shared drain area "D" while the rounded end portions of the active area respectively define the source regions "S" for the transistors. In the illustrated example, each of the active areas (e.g., 212a) defines a longitudinal axis (e.g., cutline A1) that is obliquely arranged at a slanting angle (e.g., angle θ shown in FIG. 3) with respect to the x-axis.

In the overhead layout illustration of FIG. 3, a plurality of bit lines (340-1, 340-2, etc.) that extend along the x-direction are arranged over the active areas 312a and projectively crossing a center region thereof (e.g., the "D" region between a pair of intercepting control lines 330). In the instant embodiment, a bit line contact (e.g., contact 340 as indicated by the heavily shaded dot) is provided between the center "D" region of an active area 312a and a respective bit line (e.g., 340-2) to establish electrical connection therebetween. On the other hand, the oblique arrangement of the active area 312a allows the "S" regions at the respective ends thereof to projectively offset the bit-line coverage (i.e., allowing the "S" regions of an active area 312a to be at least partially exposed from the planar coverage of a crossing bit line 313), thereby allowing a storage node contact (e.g., contact 314, denoted by a lightly shaded dot) to be formed at planar locations between the grid-like pattern (i.e., defined by the projectively intercepting control lines 312 and the bit lines 313) without shorting.

A storage element (e.g., storage capacitor 116 as shown in FIG. 1) may then be formed over the storage node contact 314. In some embodiments where a bit line width of about 20 nm is employed, the slanting angle θ may be set at arrange of about 65 to 75 degrees. In some embodiments, the slanting angle θ may be arranged at about 69 degrees (with respect to the y-axis). Accordingly, a compact layout that enables higher feature density may be achieved while maintaining sufficient device separation to keep interference issue within acceptable level.

Figure 4:
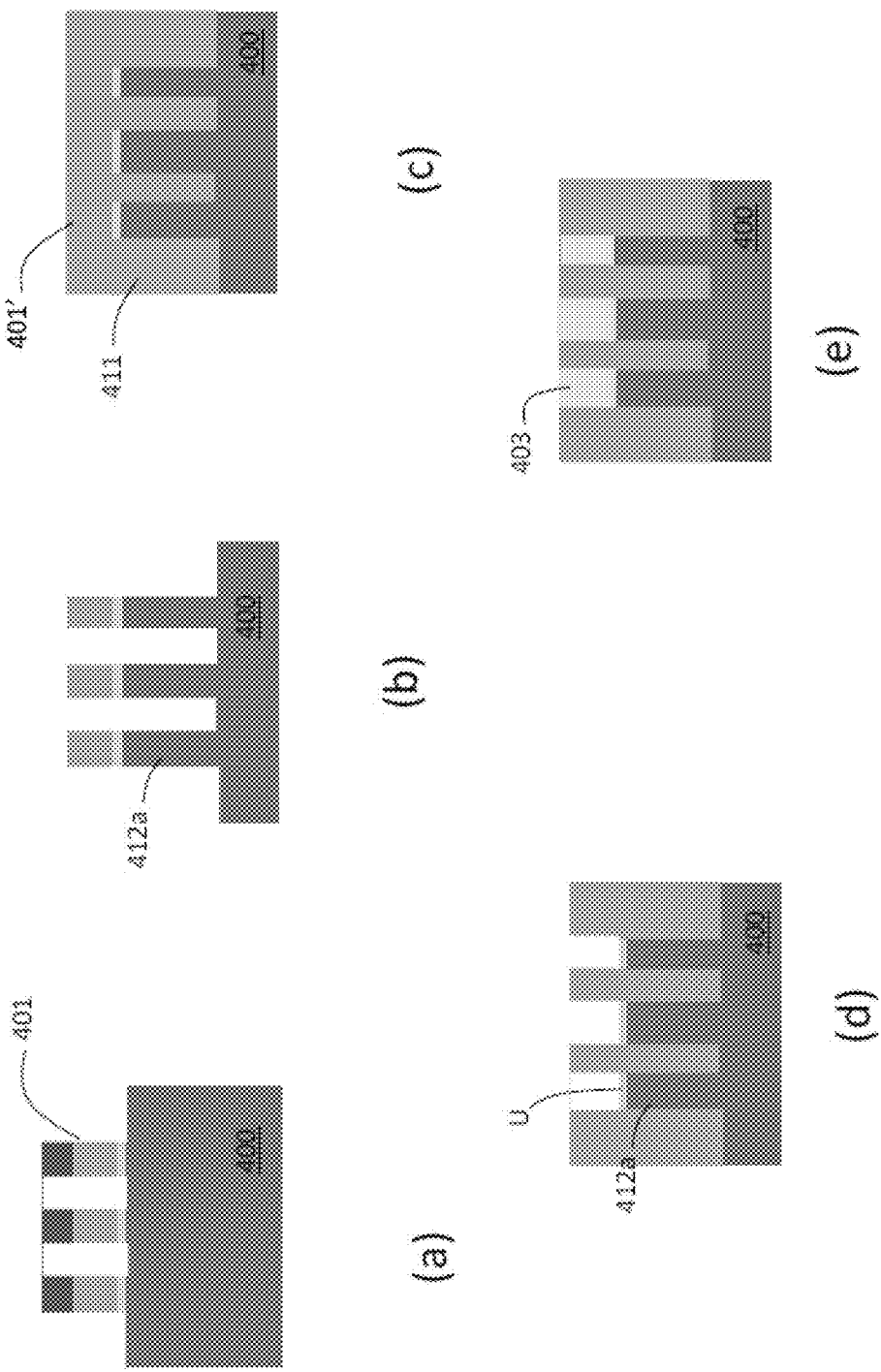
FIG. 4 shows schematic cross sectional views of intermediate structures from a cutline during various stages of fabrication processes in accordance with some embodiments of the instant disclosure.

FIG. 4 shows schematic cross sectional views of intermediate structures from a cutline during various stages of fabrication processes in accordance with some embodiments of the instant disclosure. For one thing, sectional views (a)-(e) of FIG. 4 illustrate cross sections that are taken substantially perpendicular to longitudinal axes of the active areas (e.g., along cutline S1 as shown in FIG. 3), during various stages of an exemplary active region formation process.

Referring to FIG. 4(a), a patterned mask layer 401 is provided over an active surface of a substrate 400. The etch mask 401 may comprise a multi-layered stack structure that includes, e.g., a pad oxide layer on the active area, a first hard mask layer that includes SiN, and a second hard mask layer made of Si, spin-on hard mask (SOH), Amorphous carbon layer (ACL), etc. In the illustrated embodiment, strip pattern (e.g., comparable to the planar profile shown in FIG. 3) is formed in the etch mark layer 401.

Referring to FIG. 4(b), etching operation is performed through the patterned mask layer 401 to form a plurality of raised structure of semiconductor material (e.g., fins 412a) over the active surface of the substrate 400.

Referring to FIG. 4(c), dielectric material (e.g., oxide) is disposed over the active surface of the substrate 400 and fills the gaps between neighboring fin structures 412a to form isolation structure (e.g., STI 411). A planarization process (e.g., CMP) may then be performed over the dielectric material until exposure of the second hard mask layer (thus generates a reduced mask layer 401'). In some embodiments, flow-able dielectric material(s) is applied through spin-on technique to ensure efficient step coverage and achieve proper gap-filling between the protruding structures.

Referring to FIG. 4(d), a mask stripping process is performed to remove at least a portion of the mask layer in preparation for junction engineering. Suitable dry or wet etching techniques may be applied for the stripping process to remove the mask pattern and expose an upper-most surface U of the active area 412a. In some embodiments, part of the mask layer stack (e.g., pad oxide layer) may remain over the fin structures (or remain in a different cutline, such as shown in the cross section of FIG. 5(a)). Doping process such as ion-implantation may then be carried out to adjust the electrical properties of the active area for subsequent transistor formation.

Referring to FIG. 4(e), post-stripping filling process is performed, in which dielectric material 403 (e.g., oxide) is disposed over the active areas 412a to fill the gaps that were previously occupied by the mask layer. A dry etch back or oxide CMP process may then be performed to planarize the top surface of the STI structure and the filling material 403.

Figure 5:
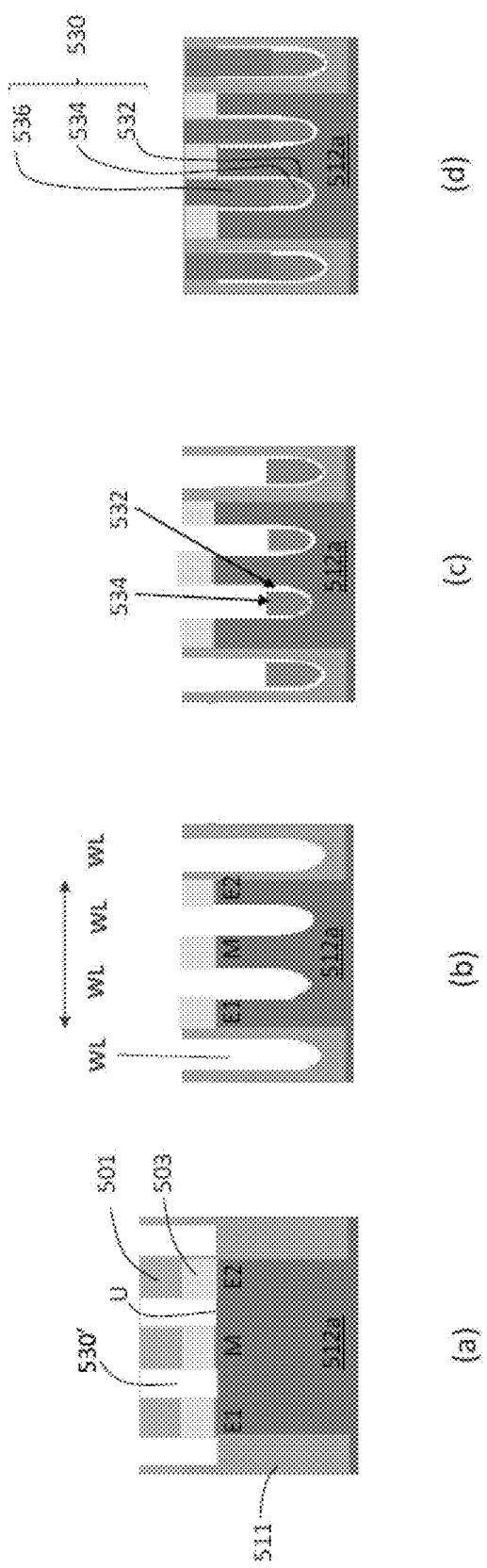
FIG. 5 shows schematic cross sectional views of intermediate structures from a cutline during various stages of fabrication processes in accordance with some embodiments of the instant disclosure.

FIG. 5 shows schematic cross sectional views of intermediate structures from a cutline during various stages of fabrication processes in accordance with some embodiments of the instant disclosure. For one thing, sectional views (a)-(d) of FIG. 5 illustrate cross sections that are taken substantially through a longitudinal axis of an active area 512a (e.g., along cutline A1 as shown in FIG. 3), during various stages of an exemplary buried gate line formation process.

Referring to FIG. 5(a), parallel-extending linear patterns 503' (e.g., the substantially parallel lines 330-1 to 330-4 that extend along the y-axis direction as shown in FIG. 3) are formed in the hard mask layer 501 over the active surface of substrate, as well as in the pad dielectric layer 503 over the plurality of raised structure of semiconductor material (e.g., fins 512a). From a planar perspective, the linear patterns 503' obliquely intercepts the fin structures at a slanting angle (e.g., angle θ as shown in FIG. 3). In the illustrated cross section, the mask layers (layers 501, 503) covers the top surface of the fin structure 512a at its middle region M and the end portions E1, E2. Meanwhile, the pattern openings 530' expose the top boundary U of the active area 512a at two locations between the mask patterns (e.g., correspond to the pair of "G" regions as shown in FIG. 3).

Referring to FIG. 5(b), etching operation is performed through the mask pattern (layers 501, 503) to generate a trench patterns WL. The trench pattern WL may include a plurality of abreast-extending linear trench features that extend in and out of the page as shown in the instant figure. The trench pattern WL may be subsequently filled to form parallel-extending word line structures that extend through (and partially embedded in) the array of active areas (e.g., fins 512a).

Referring to FIG. 5(c), dielectric layer 532 is disposed to line the exposed bottom trench surface in the active area 512a, followed by a conductor deposition process to form conductive feature 534 embedded at the bottom portion of the trench in the active area 512a. The illustrated portions of the dielectric layer 532 and conductive feature 534 may belong to a gate line structure that extends laterally over a substrate (e.g., along the y-axis direction as shown in FIG. 3), and serve as the gate dielectric layer and gate electrode thereof, respectively.

In some embodiments, the dielectric layer may be 532 may be disposed through techniques such as atomic layer deposition (ALD). In some embodiments, the dielectric layer not only electrically isolates the conductive feature 534 from the semiconductor material of the active area 512a, it also extends vertically upward and reaches the upper surface (e.g., top boundary U) of the active area 512a. In some embodiments, the buried gate conductor feature (e.g., feature 534) may be formed by a conductor deposition process that substantially fill the trench patterns WL with conductive material, followed by an etch-back process to recess the top boundary of the gate conductor to an elevation below the top boundary U of the active area 512a. As shown in the instant cross section, portions of the trench patterns WL also traverse through the isolation structure 511, and intercept other adjacent active areas that are not observable from the current view.

Referring to FIG. 5(d), capping layer 536 is formed over the conductive feature 534 and fills the trench pattern WL. The capping layer 536 may be made of material(s) that provides protection for the gate conductor (e.g., feature 534) from subsequent processes. In some embodiments, the capping layer 536 comprises nitride-containing material(s). The stack of layer 532, conductor 534, and capping 536 cooperatively form a gate line structure 530.

The gate line structure 530 may serve as word line for an array of buried type transistor in a memory device. Buried type transistor (e.g., BCAT) has become a suitable candidate for high density switching device thanks to its extended channel length (e.g., starting from a source region at E1, vertically down to the bottom tip of the gate trench under the conductive feature 534, then laterally across the tip of to the buried gate electrode (e.g., feature 534) and back up to a drain region at M). The buried type transistor (e.g., BCAT) enables higher device density while alleviating the accompanied short channel effect.

Figure 6:
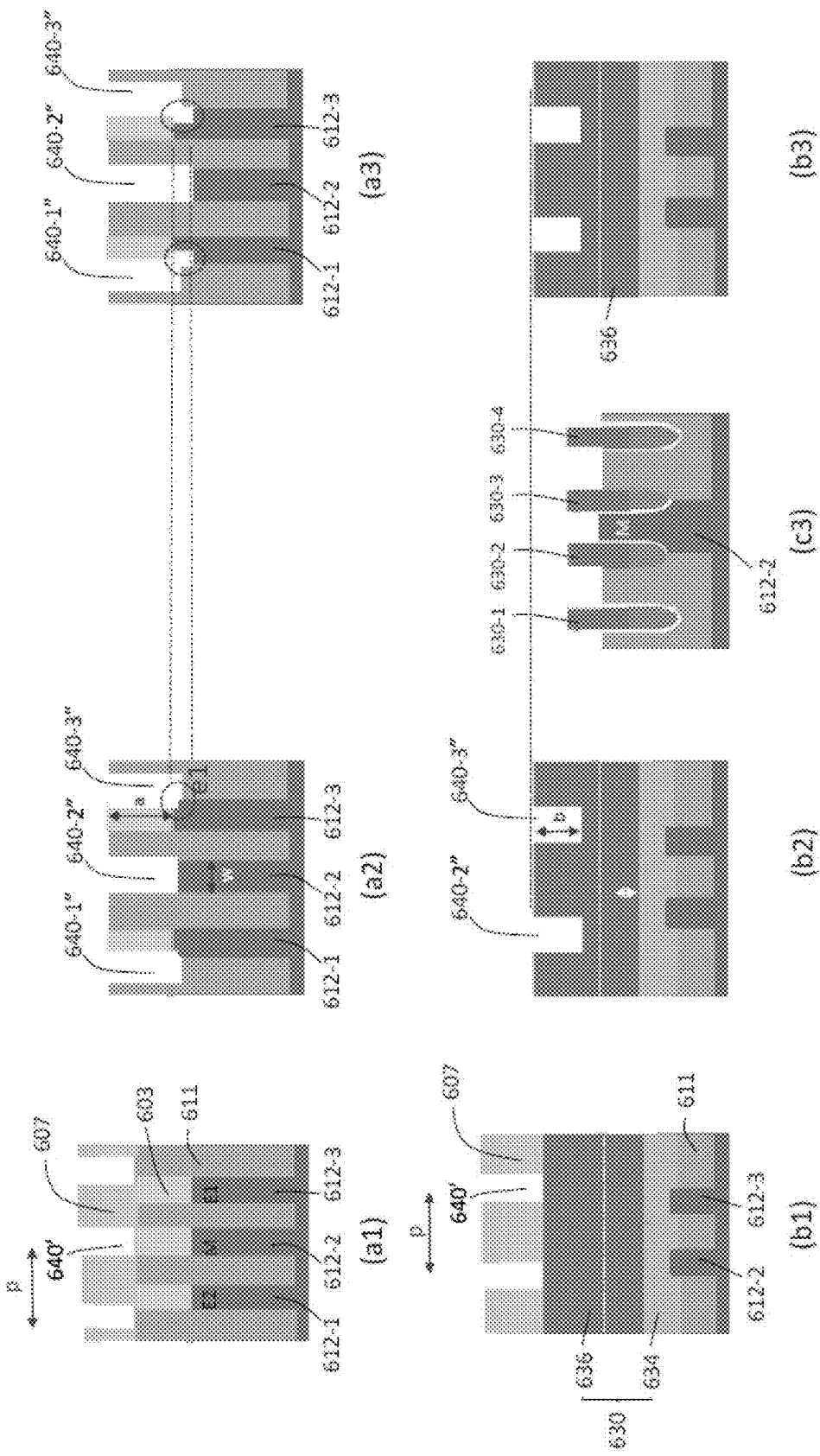
FIG. 6 shows schematic cross sectional views of intermediate structures from various cut lines during various stages of fabrication processes in accordance with some embodiments of the instant disclosure.

FIG. 6 shows schematic cross sectional views of intermediate structures from various cut lines during various stages of fabrication processes in accordance with some embodiments of the instant disclosure. Particularly, FIG. 6 shows different views from various cut-lines during an exemplary bit-line trench formation process. For one thing, sectional views (a1)-(a3) of FIG. 6 illustrate cross sections that are taken substantially across three adjacent active areas (e.g., fins 612-1, 612-2, and 612-3) at three different locations (e.g., second end portion E2, middle portion M, and first end portion E1, respectively), as indicated by cutline Y1 in FIG. 3. On the other hand, sectional views (b1)-(b3) of FIG. 6 illustrate cross sections that are taken substantially along the a word line structure (e.g., gate line 330-3 as shown previously), as indicated by cutline Y2 in FIG. 3. Meanwhile, section view (c3) of FIG. 6 illustrates a cross section taken substantially along a conductive line structure (e.g., bit-line 340-2 as shown previously), as indicated by cutline X1 in FIG. 3.

Referring to FIG. 6(*a*1), the transverse cross section (with a slight slanting angle) of three active areas (e.g., fin structures 612-1, 612-2, and 612-3) are observable from the instant cutaway view. The active areas (612-1, 612-2, 612-3) are surrounded by dielectric material of the isolation structure (e.g., STI 611), whose top boundary is at a level higher than the top surface of the fin structures. Dielectric filling material 603 is disposed over the top surface of the fins (612-1, 612-2, 612-3), and defines a top boundary that is substantially coplanar with the top boundary of the STI 611.

Etch mask 607 is disposed on the dielectric material over the fin structures 612-1, 612-2, 612-3, and patterned to form a plurality of bit-line openings 640' in preparation for bit-line (BL) trench etching process.

The bit-line openings 640' may include abreast-extending linear patterns that are separated at a regular planar interval (e.g., at pitch p). For instance, the bit-line openings (e.g., shown by linear features 340-1-340-4 in FIG. 3) may be a series of parallel line patterns that extend substantially perpendicular to the word-line structures (e.g., line features 330-1-330-4 as shown in FIG. 3) along the x-axis direction. Furthermore, the bit-line opening intercepts a row of active areas (e.g., 312*a*) at an acute angle. The bit-line openings may projectively expose the middle regions of a plurality of active areas (e.g., 340) in a same horizontal row (while the patterned etch mask 607 would cover a majority portion of the respective end portions the active areas).

Please refer concurrently to FIG. 6(*b*1). Meanwhile, from the illustrated sectional view (e.g., from cutline Y2 as shown in FIG. 3), the stack structure of gate line 630 is observable. For instance, gate conductor feature 634 and gate capping feature 636 are shown to traverse over the root of the fin structures 612-2, 612-3 (e.g., through a location between middle region and an end region of the active area 612-2). For clarity of illustration, the comparatively thin gate dielectric layer is omitted from the instant figure. From the instant view, the patterned etch mask 607 and the bit-line openings 640' can be seen disposed on top of the gate capping feature 636.

Referring to FIG. 6(*a*2), a bit-line trench formation process is performed, in which an etching operation is carried out through the bit-line openings (e.g., defined in the patterned etch mask 607). As a result, dielectric material (e.g., oxide) above certain portions of the active areas are removed, and bit-line trenches (e.g., trenches 640-1", 640-2", 640-3", each having a substantial depth of "a") are formed over the fin structures (e.g., 612-1, 612-2, 612-3). As depicted previously, each of the bit line trenches 640' obliquely intercepts a row of the fin structures (e.g., 612-2) at a middle region thereof (as can be better observed in FIG. 3). Moreover, due to the slanting intercepting angle, the bit line trench 640' exposes a full width of the middle region (e.g., width "w" in FIG. 6(*a*2)) and an edge portion (e.g., outer edge e1) of an end region of the fin structure, as indicated by the dotted circles in FIG. 3 and FIG. 6(*a*2).

Referring concurrently to FIG. 6(*b*2), the bit-line trenches (e.g., trenches 640-2", 640-3") further extend into the cross section Y2 and planarly intercepts the upper portion of the word line structure 630 (e.g, the upper capping 636). Due to the difference in material (e.g., nitride-based) and hence etch selectivity, the bit-line trench (e.g., 640-3") defines a shallower trench depth "b" at the word-line intercepting section (as compared to the trench depth "a" at the active area intersection).

Referring concurrently to FIG. 6(*c*3), which shows a sectional view along a bit-line structure (e.g., cutline X1 along line feature 340-2 as shown in FIG. 3). In the instant cross section, bit-line trench (e.g., trench 640-2") may be observed to traverse across a plurality of word-line structures (e.g., 630-1-630-4). Also can be observed from the instant cutline, two word-lines 630-2, 630-3 obliquely traverse through the middle region M of the active area 312-2.

Referring further to FIG. 6(*a*3), in which an active area trimming process is shown. During the active region trimming process, etching operation is carried out through the bit-line trenches (e.g., trenches 640-1", 640-2", 640-3") to recess the exposed middle region and the edge portion at the end region of the fin structure. For instance, the top surface of the middle region of fin 612-2 is recessed and lowered (e.g., to the lower dotted line, as compared to its original height illustrated by the higher dotted line). Meanwhile, for the neighboring fins 612-1 and 612-3, notches are generated at the respective edge portion of the active areas' end regions (e.g., the stepped notch profile as enclosed in the dotted circles in FIG. 6(*a*3) and "e1" in FIG. 3).

The trimming at the middle region of an active area (e.g., fin 612-2) may ensure better electric contact between the active area and the subsequently formed bit-line conductor (which will directly intercept an upper region of the active area at the middle region). On the other hand, the trimming at the edge portion of the end regions of neighboring fins enables further insulation measures to be taken at these areas to ensure the prevention of shorting issues between subsequently formed bit-lines (e.g., conductive lines 740-1 and 740-3 as shown in FIG. 7(*a*2)) and the edge at the end portion of the adjacent fins (e.g., fins 612-1 and 612-3).

Referring to FIG. 6(*b*3), which shows a cross sectional view at cutline Y2 during the active region trimming process. Due to mindful selection of etchant selectivity during the trimming process (which targets mainly the semiconductor material of the active area) and the protection from the upper capping 636, the sectional view of FIG. 6(*b*3) remains substantially identical to that shown in FIG. 6(*b*2).

Figure 7:
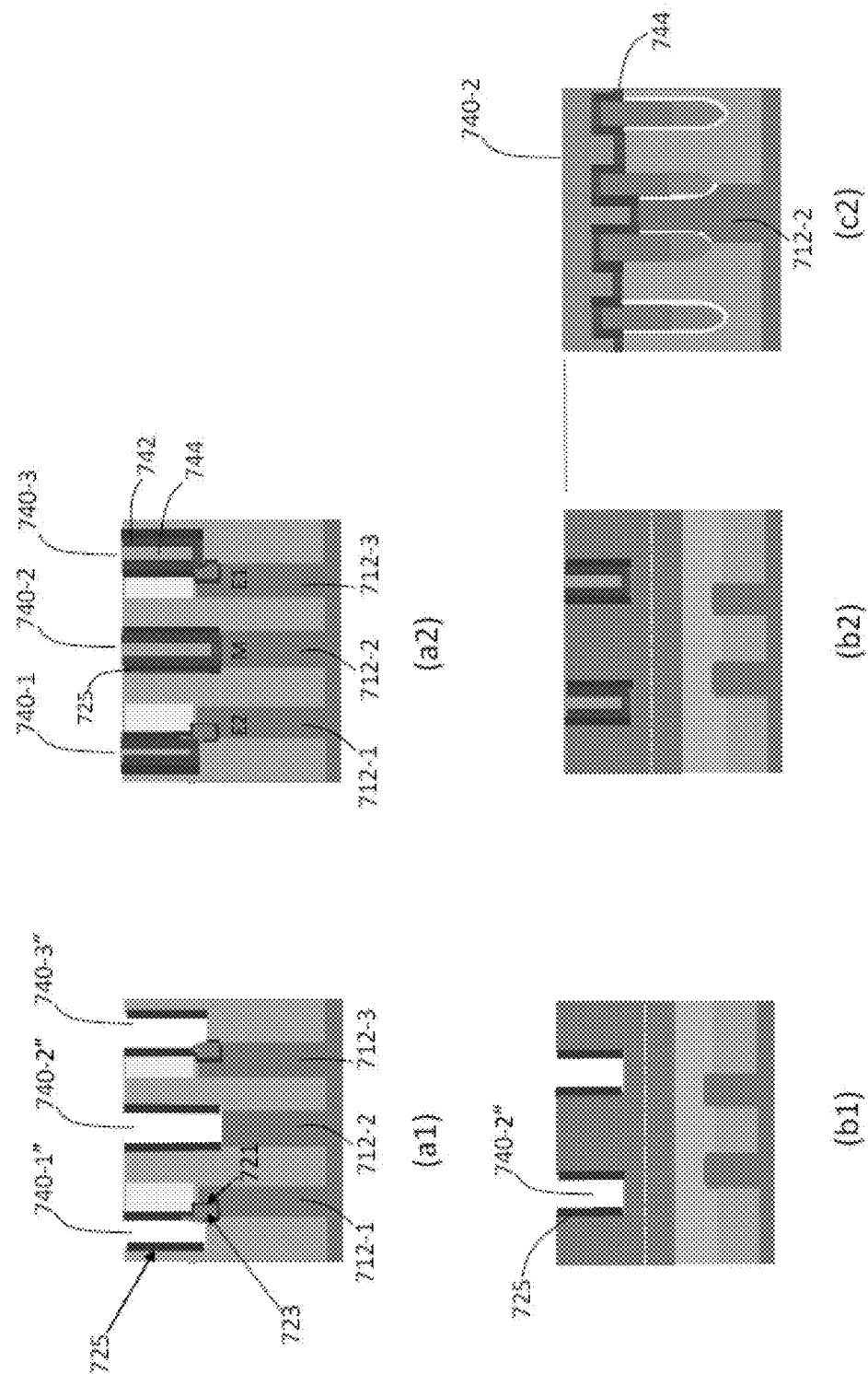
FIG. 7 shows schematic cross sectional views of intermediate structures from various cut lines during various stages of fabrication processes in accordance with some embodiments of the instant disclosure.

FIG. 7 shows schematic cross sectional views of intermediate structures from various cut lines during various stages of fabrication processes in accordance with some embodiments of the instant disclosure. Particularly, FIG. 7 shows different views from various cut-lines during an exemplary bit-line formation process. For one thing, sectional views (a1)-(a2) of FIG. 7 illustrate cross sections that are taken substantially across three adjacent active areas (e.g., fins 712-1, 712-2, and 712-3) at three different locations (e.g., second end portion E2, middle portion M, and first end portion E1, respectively), as indicated by cutline Y1 in FIG. 3. On the other hand, sectional views (b1)-(b2) of FIG. 7 illustrate cross sections that are taken substantially along the a word line structure (e.g., gate line 330-3 as shown previously), as indicated by cutline Y2 in FIG. 3. Meanwhile, section view (c2) of FIG. 7 illustrates a cross section taken substantially along a conductive line structure (e.g., bit-line 340-2 as shown previously), as indicated by cutline X1 in FIG. 3.

Please refer concurrently to FIG. 7(a1) and FIG. 7(b1), in which active area insulation (e.g., notch filling materials 721, 723) and bit-line spacer (e.g., BL spacer 725) are formed through the BL trench openings (e.g., openings 740-1", 740-2", 740-3").

In the illustrated embodiment, thin dielectric liner (e.g., oxide liner 721) is formed in the notch (e.g., notch e1 as shown in FIG. 6) at the end regions of the active regions (e.g., fins 712-1, 712-3) to cover the previously exposed semiconductor surface at the edge portion of the upper fin structure. In some embodiments, ALD is employed for the liner deposition to ensure continuous conformal coverage over the concaved notch surface.

Subsequently, notch filler 723 is disposed to fill the notch, thereby ensuring electrical insulation at the fin top region (e.g., at E1/E2) under the bit-line. In some embodiments, the notch filler 723 may comprise nitride based material, such as SiN. In some embodiments, the notch filler 723 may be disposed through techniques with sufficient gap-filling ability such as CVD, ALD, or spin-on processes.

Upon filling of the notch, BL spacer 725 may be formed over the sidewall of the BL trenches 740-1", 740-2", 740-3". The spacer 725 may comprise nitride based material. In some embodiments, the spacer 725 may comprise a composite structure that includes more than one sub-layers. For instance, in some embodiments, the spacer 725 may comprise a composite structure that includes an oxide inner layer and an outer nitride layer (not specifically shown).

In some embodiments, the spacer 725 may be conformally disposed by suitable thin film deposition techniques such as CVD or ALD, then followed by an anisotropic etch that remove a bottom portion of the conformal liner that covers over the bottom trench surface of the BL trench, thereby leaving substantially the sidewall covering portion in the BL trench. Moreover, at the middle region of the active area (e.g., region M of the fin 712-2), a lower portion of the first insulating spacer structure (e.g., spacer 725) nearer the fin structure (e.g., fin 712-2) is not wider than an upper portion that is further from the fin structure. In some embodiments, the width profile of the spacer (e.g., spacer 725) remains substantially uniform from bottom to top.

Referring concurrently to FIG. 7(a2), FIG. 7(b2), and FIG. 7(c2), in which an exemplary bit-line filling process is illustrated. Subsequent to the formation of the BL spacer (e.g., spacer 725), buffer liner 742 is disposed to provide conformal coverage over the exposed trench surface (e.g., covering the exposed surface of the BL trench 740-1" without filling it). The buffer liner 742 may comprise one or more conductive material that enhances adhesion between dielectric material (e.g., spacer 725) and the subsequently disposed BL conductor (e.g., conductor 744). The buffer liner 742 may also be made of material(s) that provides anti-diffusion properties (e.g., to serve as a barrier layer in cases where the BL conductor 744 comprises electro-chemically active materials such as Cu). In some embodiments, the buffer liner 742 may include one or more of Ta, Ti, Co, or the nitride compounds thereof.

Upon the formation of buffer liner (e.g., liner 742), BL conductor 744 is disposed to fill the remaining of the BL trench (e.g., 740-1", etc). In some embodiments, the BL conductor 744 may include one or more metal materials such as W, Ru, Co.

Accordingly, as shown in FIG. 7(a2), at a middle region (e.g., region M) of an active region (e.g., fin 712-2), a bit line structure 740-2 is formed to directly intercept the active region at a level that is lower than a top-most surface_thereof (e.g., as compared to the top boundaries of the adjacent fins 712-1/712-3). The bit line structure 740-2 includes a barrier liner 725 having a U-profile in a width direction that is in electrical contact with the active region 712-2.

On the other hand, as shown in FIG. 7(c2), along the cross section in a longitudinal direction of a BL conductor (e.g., BL 740-2), the buffer liner 744 conformally lines the uneven topological contour (e.g., over the plurality WL capping, isolation, and active regions). Accordingly, from this perspective, the buffer liner 744 possesses a substantially square wave profile, where a lower most portion of the buffer liner being in direct electrical contact with the middle region of the first fin structure 712-2.

As can be observed from various views in FIG. 7, the direct intercept of bit-line structure (e.g., BL 740-2) through the active regions (e.g., top portion of the middle section M of the fin 712-2) removes the need for additional vertical interconnect components (e.g., the bit-line contact 141 as illustrated in FIG. 1). The elimination of vertical bit-line contact features in turn bypasses the need for the corresponding photo-mask(s) and the burden of the accompanied complex multiple patterning processes.

Figure 8:
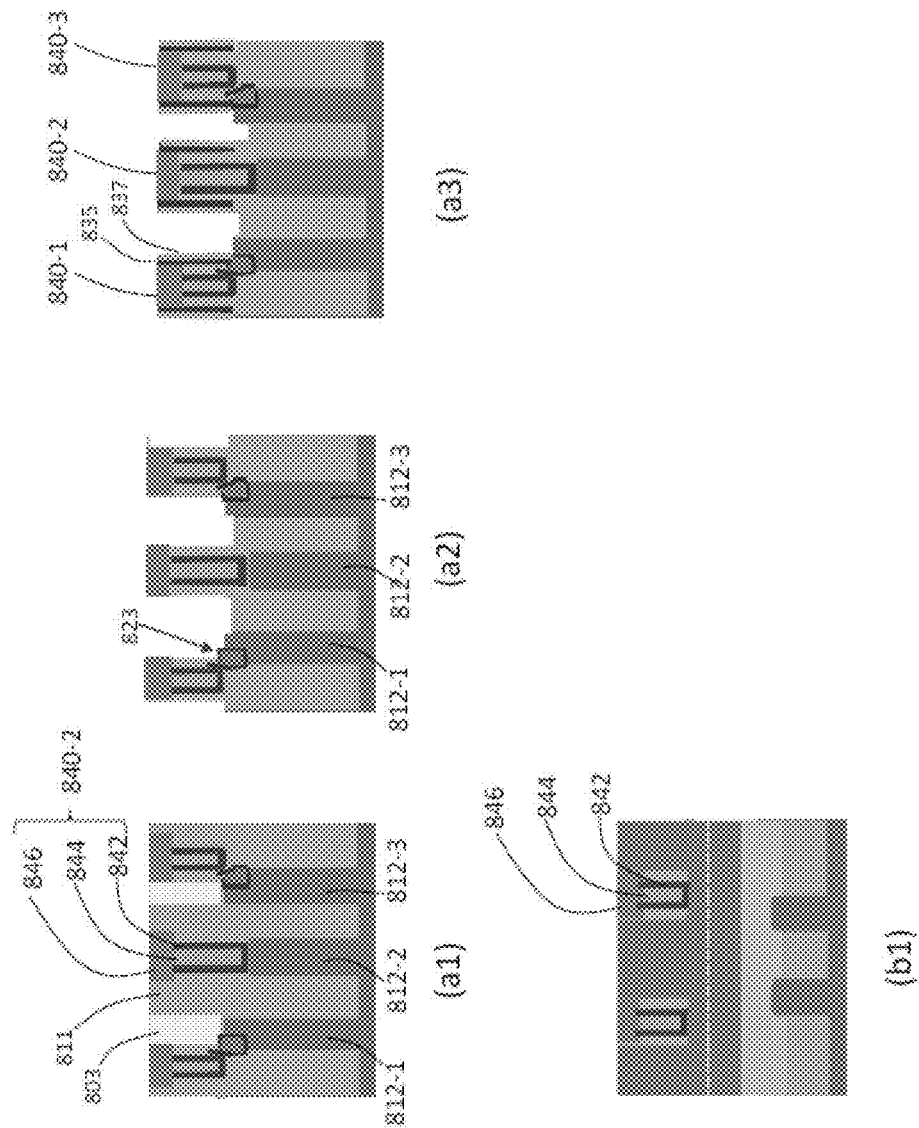
FIG. 8 shows schematic cross sectional views of intermediate structures from various cut lines during various stages of fabrication processes in accordance with some embodiments of the instant disclosure.

FIG. 8 shows schematic cross sectional views of intermediate structures from various cut lines during various stages of fabrication processes in accordance with some embodiments of the instant disclosure. Particularly, FIG. 8 shows different views from various cut-lines during an exemplary BL capping and storage node formation process. For one thing, sectional views (a1)-(a2) of FIG. 8 illustrate cross sections that are taken substantially across three adjacent active areas (e.g., fins 812-1, 812-2, and 812-3) at three different locations (e.g., as indicated by cutline Y1 in FIG. 3). Meanwhile, sectional view (b1) of FIG. 8 illustrate cross sections that are taken substantially along the a word line structure (e.g., gate line 330-3) as indicated by cutline Y2 in FIG. 3.

Referring concurrently to FIG. 8(a1) and FIG. 8(b1), in which BL capping 846 is formed over the buffer liner 842 and the BL conductor 844. In some embodiments, the BL capping formation process comprises recessing the buffer liner and the BL conductor (e.g., from the previously filled level as shown in FIG. 7(a2)) to a level below a top boundary of the surrounding dielectric material (e.g., the filling oxide 803 over the fin top and the STI 811 around the fin structures). A dielectric deposition process is then performed to dispose dielectric material (e.g., nitride) over the recessed BL conductor, followed by a polishing process (e.g., CMP) to planarize the top boundaries of the BL capping 846, the filling oxide 803, and the STI 811. As such, a bit-line structure (e.g., 840-2) that comprises buffer liner (e.g., liner 842), BL conductor (e.g., metal 844), and BL capping (e.g., capping feature 846) may be formed.

Please refer to FIG. 8(a2), which shows a storage node contact etching process. In the illustrated embodiment, dielectric material between bit-line structures (e.g., the filling oxide 803 and an upper portion of the STI 811) is removed (e.g., through oxide etching) to expose a top corner of adjacent active area (e.g., the inner corner of fins 812-1/812-3 opposite to the insulating notch filling 823). In some embodiments, this exposed location (i.e., between adjacent BL structures) may correspond to the location of a storage node contact (e.g., as illustrated by the lighter-shaded dots shown in FIG. 3).

Figure 9:
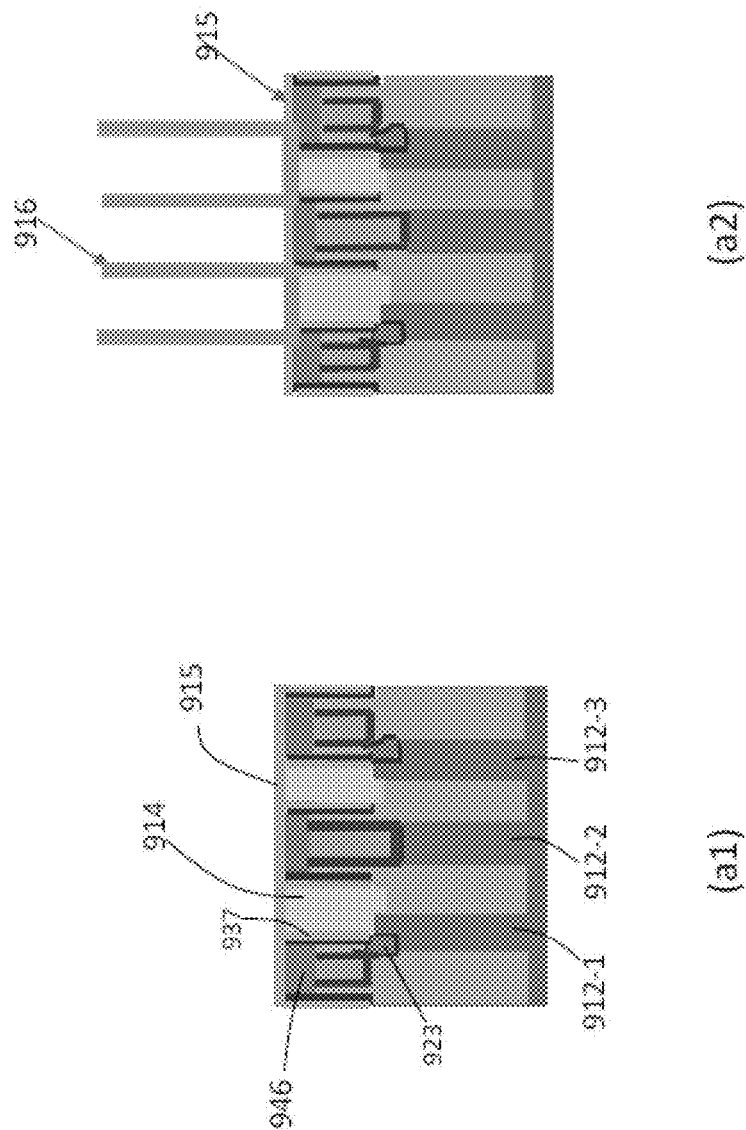
FIG. 9 shows schematic cross sectional views of intermediate structures from a cutline during various stages of fabrication processes in accordance with some embodiments of the instant disclosure.

By using the bit-line structures (e.g., their side wall spacers) as self-assembled mask, the subsequent storage node contact (e.g., landing plug 914 as shown in FIG. 9(a1)) may be formed without a dedicated photo-mask, thereby further reducing fabrication complexity and costs.

Referring to FIG. 8(a3), which shows an exemplary storage contact spacer formation process. For instance, in the illustrated embodiment, inner spacer layer (e.g., oxide sub-layer 835) and outer spacer layer (e.g., nitride sub-layer 837) are formed over the opposing sidewalls between adjacent BL structures (e.g., BL 840-1, 840-2). Nevertheless, in some embodiments, the one or more of the spacer sub-layer may be optional.

FIG. 9 shows schematic cross sectional views of intermediate structures from a cutline during various stages of fabrication processes in accordance with some embodiments of the instant disclosure. Particularly, FIG. 9 shows different views from various cut-lines during an exemplary storage landing plug and storage node formation process. For one thing, sectional views (a1)-(a2) of FIG. 9 illustrate cross sections that are taken substantially across three adjacent active areas (e.g., fins 912-1, 912-2, and 912-3) at three different locations (e.g., as indicated by cutline Y1 in FIG. 3).

Referring to FIG. 9(a1), conductive material (e.g., feature 914) is disposed between spacer structures of adjacent bit line structures to form landing plug 914 that extends vertically there-between. The landing plug 914 may comprise metal or none-metal conductive materials such as doped polysilicon, aluminum, tungsten, ruthenium, and cobalt. Subsequent to the conductor deposition process, a planarization process may be carried out over the BL capping 946 and the conductive feature 914. A separation layer 915 (e.g., made of nitride-based material) may then be formed over the planarized surface to provide protection and serve as an etch stop layer for the subsequent storage node formation process.

In the illustrated cross section, the landing plug 914 extends substantially vertically between fin structures (e.g., between fins 912-1, 912-2) and electrically contacts the end region of fin structure (e.g., fins 912-1) at a side opposing the notch filler (feature 923). In some embodiments, the landing plug 914 can also be observed in contact with the outer spacer layer (e.g., nitride spacer 937) over the notch filler 923.

Referring to FIG. 9(a1) and FIG. 9(a2), storage nodes (e.g., capacitor structure 916) are formed over and in electrical contact with the storage node contacts (e.g., landing plug 914).

Accordingly, one aspect of the instant disclosure provides a semiconductor device, which comprises: a first fin structure(Si) having a strip planar profile over a substrate; and a first conductive line structure intercepting a middle region of the first fin structure at a level that is lower than a top surface_thereof.

In some embodiments, the first conductive line structure intercepts the first fin structure at an oblique angle from planar perspective, the oblique angle is from about 65 to 75 degrees.

In some embodiments, the first conductive line structure comprises: a buffer liner having a substantially U-profile in a cross-section in a width direction of the first conductive line structure (BL), the buffer liner being in electrical contact with the middle region of the first fin structure; a metal layer in the U-profile of the buffer liner; and a capping layer over the metal layer.

In some embodiments, the first conductive line structure comprises: a buffer liner having a substantially square wave profile in a cross-section in a longitudinal direction of the first conductive line structure, the buffer liner being in electrical contact with the middle region of the first fin structure; a metal layer over the buffer liner; and a capping layer over the metal layer.

In some embodiments, the device further comprises: a first insulating spacer structure extending from the first fin structure and covering sidewall of the first conductive line structure, wherein a lower portion of the first insulating spacer structure nearer the first fin structure is not wider than an upper portion that is further from the first fin structure.

In some embodiments, the first insulating spacer structure comprises an outer nitride layer.

In some embodiments, the device further comprises: a second fin structure having a strip planar profile over the substrate, the second fin structure having an end region overlapping the middle region of the first fin structure in a cross-section, a second conductive line structure extending abreast the first conductive line structure, the second conductive line structure having a second insulating spacer structure extending from the second fin structure and covering sidewall of the second conductive line structure, wherein the second insulating spacer structure comprises an outer nitride layer; and a landing plug extending vertically between and in contact with the outer nitride layers of the first and the second conductive line structures, and wherein the vertical landing plug electrically contacts an inner edge of the second fin structure that is closer to the first fin structure.

In some embodiments, the second fin structure has a step notch profile at an outer edge opposing the inner edge, wherein a nitride dielectric material fills the step notch profile.

In some embodiments, the device further comprises: a storage node arranged over the landing plug and in electrical connection with the end region of the second fin structure through the landing plug.

In some embodiments, the device further comprises: a gate line structure obliquely intercepting the first active region and extending under the first word line structure, the gate line structure being substantially perpendicular with respective to the first word line structure in a planar view.

Accordingly, another aspect of the instant disclosure provides a semiconductor device, which comprises: a first active region over a substrate; and a first word line structure intercepting the first active region at a level that is lower than a top surface_thereof, the first bit line structure including a barrier liner having a U-profile in a width direction thereof in electrical contact with the first active region.

In some embodiments, the device further comprises: a first bit line spacer vertically extending from the first active region and covering sidewall of the first bit line structure, wherein a lower portion of the first bit line spacer nearer the first active region is not wider than an upper portion that is further from the first active region, and wherein the first bit line spacer comprises an outer nitride layer.

In some embodiments, the device further comprises: a second active region over the substrate, the second active region overlapping the middle region of the first active region in a cross-section, a second bit line structure extending abreast the first bit line structure, the second bit line structure having a second bit line spacer extending from the second active region and covering sidewall of the second bit line structure, wherein the second bit line spacer comprises an outer nitride layer; and a landing plug extending vertically between and in contact with the outer nitride layers of the first and the second bit line structures, and wherein the landing plug electrically contacts an inner edge of the second active region that is closer to the first active region.

In some embodiments, the second active region has a notch in the cross-section at an outer edge opposing the inner edge, wherein a nitride dielectric material fills the notch.

In some embodiments, the device further comprises: a capacitor structure arranged over the landing plug and in electrical connection with the second active region through the landing plug.

In some embodiments, the device further comprises: a word line structure buried in the first active region under the first bit line structure.

Accordingly, yet another aspect of the instant disclosure provides a method for fabricating semiconductor device, which comprises: forming a plurality of fin structures over a substrate, each of the fin structures having a strip planar profile; disposing dielectric material between and over the fin structures; patterning dielectric material to form bit line trenches abreast one another over the fin structures, wherein each of the bit line trenches obliquely intercepts a row of the fin structures at respective middle region thereof, the bit line trench exposing a full width of the middle region and an edge portion of an end region of the fin structure; recessing the middle region and the edge portion of the end region of the fin structure, thereby lowering a top surface of the middle region and generating a notch at the edge portion of the end region; forming spacer structure over sidewall surface of the bit line trench, the spacer structure filling the notch at the edge portion of the end region; forming buffer liner conformally over exposed surfaces of the spacer structure and the middle region of the fin structure; and disposing metal material over the buffer liner and filling the bit line trench to form bit line structures.

In some embodiments, the method further comprises: prior to the patterning to form bit line trenches, forming word line structures obliquely intercepting the fin structures, the word line structures being lower than and substantially perpendicular to the bit line structures.

In some embodiments, the method further comprises: disposing conductive material between spacer structure of adjacent bit line structures to form landing plug that extends vertically there-between, the landing plug electrically contacting the end region of fin structure at a side opposing the notch.

In some embodiments, the method further comprises: forming capacitor structure over and in electrical contact with the landing plug.

The embodiments shown and described above are only examples. Many details are often found in the art such as the other features of a logistics data management method. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A semiconductor device, comprising:
   a first fin structure having a strip planar profile over a substrate;
   a first conductive line structure intercepting a middle region of the first fin structure at a level that is lower than a top-most surface of the first fin structure;
   a second fin structure having a strip planar profile over the substrate, the second fin structure having an end region overlapping the middle region of the first fin structure in a planar view in a direction perpendicular to the top surface of the substrate; and
   a second conductive line structure extending abreast the first conductive line structure;
   wherein the first conductive line structure intercepts the first fin structure at an oblique angle from planar perspective, the oblique angle is from 65 to 75 degrees, the second fin structure has a step notch profile at an outer edge opposing the inner edge, a nitride dielectric material fills the notch profile.

2. The device of claim 1, wherein
   the first conductive line structure comprises:
   a buffer liner having a U-profile in a cross-section in a width direction of the first conductive line structure, the buffer liner being in electrical contact with the middle region of the first fin structure;
   a metal layer in the U-profile of the buffer liner; and
   a capping layer over the metal layer.

3. The device of claim 1, wherein
   the first conductive line structure comprises:
   a buffer liner having a square wave profile in a cross-section in a longitudinal direction of the first conductive line structure, the buffer liner being in electrical contact with the middle region of the first fin structure;
   a metal layer over the buffer liner; and
   a capping layer over the metal layer.

4. The device of claim 1, further comprising:
   a first insulating spacer structure extending from the first fin structure and covering sidewall of the first conductive line structure,
   wherein a lower portion of the first insulating spacer structure nearer the first fin structure is not wider than an upper portion that is further from the first fin structure.

5. The device of claim 4, wherein
   the first insulating spacer structure comprises an outer nitride layer.

6. The device of claim 5,
   wherein the second conductive line structure has a second insulating spacer structure extending from the second fin structure and covering sidewall of the second conductive line structure;
   wherein the second insulating spacer structure comprises an outer nitride layer;
   the device further comprises a landing plug extending vertically between and in contact with the outer nitride layers of the first and the second conductive line structures, and wherein the vertical landing plug electrically contacts an inner edge of the second fin structure that is closer to the first fin structure.

7. The device of claim 6, further comprising:
a storage node arranged over the landing plug and in electrical connection with the end region of the second fin structure through the landing plug.

8. The device of claim 1, further comprising:
a gate line structure obliquely intercepting the first fin structure and extending under the first conductive line structure, the gate line structure being perpendicular with respective to the first conductive line structure in a planar view.

9. A semiconductor device, comprising:
a first active region over a substrate;
a first bit line structure intercepting the first active region at a level that is lower than a top-most surface thereof, the first bit line structure including a barrier liner having a U-profile in a width direction thereof in electrical contact with the first active region;
a second active region over the substrate, the second active region overlapping the middle region of the first active region in a planar view in a direction perpendicular to the top surface of the substrate; and
a second bit line structure extending abreast the first bit line structure;
wherein the first bit line structure intercepts the first active region at an oblique angle from planar perspective, the oblique angle is from about 65 to 75 degrees, the second active region has a notch in the cross-section at an outer edge opposing the inner edge, a nitride dielectric material fills the notch.

10. The device of claim 9, further comprising:
a first bit line spacer vertically extending from the first active region and covering sidewall of the first bit line structure,
wherein a lower portion of the first bit line spacer nearer the first active region is not wider than an upper portion that is further from the first active region, and
wherein the first bit line spacer comprises an outer nitride layer.

11. The device of claim 10,
wherein the second bit line structure has a second bit line spacer extending from the second active region and covering sidewall of the second bit line structure,
wherein the second bit line spacer comprises an outer nitride layer;
wherein the device further comprises a landing plug extending vertically between and in contact with the outer nitride layers of the first and the second bit line structures, and wherein the landing plug electrically contacts an inner edge of the second active region that is closer to the first active region.

12. The device of claim 11, further comprising:
a capacitor structure arranged over the landing plug and in electrical connection with the second active region through the landing plug.

13. The device of claim 9, further comprising:
a word line structure buried in the first active region under the first bit line structure.

* * * * *